(12) United States Patent
Kemper

(10) Patent No.: US 7,787,224 B2
(45) Date of Patent: Aug. 31, 2010

(54) PROTECTION CIRCUIT FOR AN INTEGRATED CIRCUIT DEVICE

(75) Inventor: Wolfgang Kemper, Unterföhring (DE)

(73) Assignee: NXP B.V., Eindhoven (NL)

( * ) Notice: Subject to any disclaimer, the term of this patent is extended or adjusted under 35 U.S.C. 154(b) by 813 days.

(21) Appl. No.: 10/562,237

(22) PCT Filed: Jun. 23, 2004

(86) PCT No.: PCT/IB2004/050973

§ 371 (c)(1),
(2), (4) Date: Mar. 29, 2006

(87) PCT Pub. No.: WO2005/002019

PCT Pub. Date: Jan. 6, 2005

(65) Prior Publication Data

US 2006/0268473 A1 Nov. 30, 2006

(30) Foreign Application Priority Data

Jun. 30, 2003 (EP) .................................. 03101950

(51) Int. Cl.
*H02H 9/00* (2006.01)
*H02H 3/22* (2006.01)
*H02H 9/02* (2006.01)
(52) U.S. Cl. .................... 361/56; 361/111; 361/91.3
(58) Field of Classification Search .................. 361/56, 361/111, 91.3
See application file for complete search history.

(56) References Cited

U.S. PATENT DOCUMENTS

| 4,612,497 | A | * | 9/1986 | Ulmer | 323/315 |
|---|---|---|---|---|---|
| 4,802,054 | A | * | 1/1989 | Yu et al. | 361/56 |
| 5,430,602 | A | * | 7/1995 | Chin et al. | 361/212 |
| 5,581,199 | A | * | 12/1996 | Pierce et al. | 326/41 |
| 5,617,283 | A | * | 4/1997 | Krakauer et al. | 361/56 |
| 5,717,324 | A | * | 2/1998 | Tobita | 323/313 |
| 5,717,648 | A | * | 2/1998 | Davis et al. | 365/230.06 |
| 5,973,901 | A | * | 10/1999 | Narita et al. | 361/111 |
| 6,031,405 | A | * | 2/2000 | Yu | 327/313 |
| 6,078,487 | A | | 6/2000 | Partovi et al. | |
| 6,501,632 | B1 | * | 12/2002 | Avery et al. | 361/111 |
| 6,522,511 | B1 | * | 2/2003 | John et al. | 361/56 |
| 6,912,109 | B1 | * | 6/2005 | Ker et al. | 361/56 |
| 2002/0050615 | A1 | * | 5/2002 | Ker et al. | 257/355 |
| 2003/0043523 | A1 | | 3/2003 | Hung et al. | |
| 2003/0202300 | A1 | * | 10/2003 | Tyler et al. | 361/56 |
| 2003/0235022 | A1 | * | 12/2003 | Lai et al. | 361/111 |

\* cited by examiner

*Primary Examiner*—Jared Fureman
*Assistant Examiner*—Lucy Thomas

(57) ABSTRACT

The integrated protection circuit according to the invention for ESD protecting an circuit device having at least one pad, e.g. a I/O pad, comprises a first transistor (MPI) whose control outputs are connected between the pad (2, 3) and the control input of a clamp transistor (MN4). The control outputs of the clamp transistor (MN4) are connected between the pad (2, 3) and a reference terminal (4). The protection circuit further comprises a second transistor (MN3) whose control outputs are connected between the control output of the first transistor (.MP 1) and the reference terminal (4). Finally the protection circuit also comprises time-delay elements (R, MN 1) connected between a supply voltage terminal (1) and the control inputs of the first transistor (MP I) and the second transistor (MN3).

14 Claims, 2 Drawing Sheets

PROTECTION CIRCUIT FOR AN INTEGRATED CIRCUIT DEVICE

The invention relates to an integrated circuit for protecting a circuit device from damage resulting from electrostatic discharge.

Integrated circuits, especially sensitive circuits in complementary metal oxide semiconductor (CMOS) tecdmology, have to be protected against defects caused by a sudden electrostatic discharge (ESD). An ESD can have the consequence of a voltage breaking through a dielectric between two surfaces, in the end resulting in a short circuit, damaging the gate oxide/diffusion, the metal layers, or the contacts of the integrated circuit. The electrostatic charge existing prior to the sudden discharge of the circuit usually results from contact with an electrostatically charged object, e.g. a person or a machine.

For this purpose, i.e. protection from ESD, one or more specially designed protection circuits are usually integrated on the substrate of the circuit to be protected. Such a protection circuit is activated when a dangerous current or voltage discharge occurs and switches into a low-impedance state to keep the sensitive areas of the circuit safeguarded.

In most modem processes, the ESD protection circuits are one of several area-limiting devices, especially with regard to input/output (I/O) pads. It is thus advantageous or even necessary to reduce the chip area consumed by the protection circuit and still achieve sufficient protection. Furthermore, for high speed radio frequency (RF) I/O designs, the capacitance of the ESD protection circuit must be as low as possible, whereby the capacitance depends on the chip area used for the ESD protection.

Today, ESD protection usually relies on the breakthrough mechanism of the P-N junction of an ESD protection transistor. Curve 11 in the current voltage diagram in FIG. 1 illustrates this. The limitation in ESD robustness consists in the fact that the ESD clamp has a differential resistance during an ESD event. The voltage drop during an ESD event reaches a value where the integrated circuit is no longer protected. Typical failures are drain damages of small N-MOS transistors or gate oxide breakdowns.

In Partovi et al. U.S. Pat. No. 6,078,487, an electrostatic discharge protection device having a modulated control input terminal is described. The protection circuit, guarding an associated integrated circuit from damage due to electrostatic discharge, includes a N-MOS transistor seiving as clamping device and a gate modulation circuit. The source and the drain of the N-MOS transistor clamp are connected between an input/output pad of the integrated circuit and a ground reference voltage. During normal operation of the integrated circuit, the gate modulation circuit disables the N-MOS transistor clamp by connecting its gate terminal to a ground reference voltage. During an ESD event, the gate modulation circuit connects the gate to the input/output pad, which enables the N-MOS transistor clamp, causing any ESD voltages and resulting currents to be shunted through the N-MOS transistor clamp to ground. However, when an ESD or electrostatic overstress (EOS) event occurs, which causes a positive voltage at the supply terminal Vdd of the clamp modulator, the voltage caused by an ESD or electrostatic overstress cannot be shunted through the N-MOS transistor clamp to ground because the N-MOS transistor clamp is disabled. Therefore, in this case an ESD or electrostatic overstress can damage the gate oxide, the metal layers or the contacts of the integrated circuit.

An object of the invention is to provide an integrated protection circuit which protects an integrated circuit having a pad, e.g. an I/O pad or a power supply pad, from electrostatic discharge or electrostatic overstress during different stress conditions.

With the integrated protection circuit according to the invention, chip area can be saved without diminishing the protection from electrostatic discharge or electrostatic overstress. Alternatively or additionally, the protection from electrostatic discharge or electrostatic overstress can be improved considerably without consuming more chip area.

The problem is solved by an integrated protection circuit with the features according to independent claim 1.

The integrated protection circuit according to the invention comprises a first transistor whose control outputs are connected between the pad and the control input of a clamping device, wherein the control outputs of the clamping device are connected between the pad and a reference voltage terminal. The protection circuit further comprises a second transistor whose control outputs are connected between the control output of the first transistor and the reference voltage terminal. Finally the protection circuit also includes a time-delay element connected between a supply voltage terminal and the control inputs of the first transistor and the second transistor.

Advantageous further developments of the invention arise from the features indicated in the dependent patent claims.

In one embodiment of the invention, the pad of the integrated protection circuit is a signal input/output pad or a power supply pad.

In another embodiment of the invention, the time-delay element of the integrated protection circuit comprises a series connection of a resistor and a capacitance.

In a further embodiment of the invention, the time-delay element of the integrated protection circuit comprises a third transistor, wherein the resistor is connected between the supply voltage terminal and the third transistor, and wherein the third transistor forms the capacitance.

Advantageously, the integrated protection circuit comprises a fourth transistor whose control outputs are connected between the reference voltage terminal and the control output of the third transistor and wherein the control input of the fourth transistor is also connected to the reference voltage terminal.

Furthermore, the first transistor of the integrated protection circuit can be a p-channel MOS transistor.

For solving the object of the invention, the second, third and fourth transistor of the integrated protection circuit can be formed as n-channel MOS transistors.

In a typical application the clamping device of the integrated protection circuit according to the invention is a n-channel MOS transistor layouted for ESD protection.

Alternatively thereto, the clamping device of the integrated protection circuit according to the invention can be a parasitic npn transistor.

Alternatively thereto, the clamping device of the integrated protection circuit according to the invention can also be formed as a thyristor.

Finally, the integrated protection circuit for protecting a circuit device can comprise a diode connected between the pad and the supply voltage terminal.

Subsequently, the invention is further explained with the drawings showing in

FIG. 1 a current voltage diagram for an ESD protection circuit according to the prior art and for an ESD protection circuit according to the invention;

FIG. 2 an embodiment of an ESD protection circuit according to the invention;

FIG. 3 an embodiment of an ESD protection circuit according to the invention used for a power pad;

FIG. 4 a block diagram of the ESD protection circuit according to the invention used for an I/O pad;

FIG. 5 a block diagram of the ESD protection circuit according to the invention used for a power pad and FIG. 6 a block diagram with a parasitic diode in the integrated circuit.

The idea of the invention is to have a robust element which handles the ESD current during an ESD event before more sensitive internal devices can be damaged. Most common elements are diodes, N-MOS transistors and low-voltage-triggered silicone rectifiers (LVTSCR). All these devices have breakdown values higher than the operating voltage of the integrated circuitry which has to be protected.

FIG. 1 shows, beside the curve 11 illustrating the current voltage course for an ESD protection circuit according to the prior art, also a curve 12 illustrating the current voltage course for an ESD protection circuit according to the invention.

As it can be seen from this curve 12, the ESD detection circuit clamps the voltage caused by the ESD event much earlier than a conventional ESD clamp. Thereby, a lower voltage drop U1 over the clamp transistor MN4, which is shown in FIG. 2, is achieved. The voltage drop over a clamp transistor according to the prior art is indicated in FIG. 1 with U2.

The ESD test is carried out on a non operating integrated circuit (IC). During the ESD test any pulse, regardless of the voltage level, must be prevented. Therefore, it is not necessary to have an ESD protection with a trigger voltage higher than the operating voltage of the IC.

One idea of the invention is to clamp every pulse at the lowest possible voltage level. This is in common CMOS technology the threshold voltage Utr of a transistor, which is about 0.6V. During the normal operating mode of the IC this behavior is switched off and the protection circuit operates like a common voltage clamp.

In FIG. 2 an embodiment of an ESD protection circuit according to the invention is depicted. For this purpose, a supply terminal 1 for a supply voltage VDD is connected over a resistor R to the drain and gate terminals of a first n-channel metal oxide field effect transistor (N-MOSFET) MN 1. The source terminal of the first N-MOS transistor NM1 is connected to the drain terminal of a second N-MOS transistor MN2. The gate terminal and the source terminal in turn are connected at the reference voltage terminal 4 to a reference potential VSS, which is the ground of the complete circuit. A p-channel MOS transistor MP1 and a third N-MOS transistor MN3 form an inverter INV whose input NET1 is connected to the source of the first N-MOS transistor NM1 and the drain terminal of the second N-MOS transistor MN2. The output NET2 of the inverter INV is connected to the gate terminal of a fourth N-MOS transistor NM4 which works as main clamp of the ESD protection circuit. The part of the ESD protection circuit inside of the doted line is called in the following active trigger control AC, while the transistor MN4 is called clamp transistor.

The protection circuit shown in FIG. 2 can be brought in two different operating modes, a normal operating mode and an event driven mode. Both modes are explained in the following.

In the first, normal, operating mode, a so-called clamp mode, the supply terminal 1 of protection circuit is powered up and the ground terminal 4 is connected to ground. In this normal operating case the circuit is not stressed with ESD or EOS. The protection circuit now operates as follows. At first, the first N-MOS transistor MN1 is turned on, this means it is conducting. Secondly, the second N-MOS transistor MN2 is turned off and gets nonconducting. Therefore, in the next step the input NET1 of the inverter INV gets high and its output NET 2 low. Finally, the main clamp MN4 is switched off. The consequence is, that the I/O pad 2 is not connected to ground but can be used as I/O pad 2.

If an overvoltage, i.e. caused by ESD or EOS, during the normal operation occurs the main clamp MN4 will act like a common used gate grounded NMOS transistor (GGNMOST) and will protect the complete circuit.

In the second mode, the event driven mode, there are four different operating conditions. In all operating conditions all nodes or pads of the circuit are floating during an ESD test except the pin to be tested and the corresponding grounded pin.

First Operating Condition:

An I/O pad 2 shall be tested with a test voltage Vpad wherein the test voltage Vpad is positive versus the reference potential VSS. The circuitry works as follows. The supply voltage VDD at the supply terminal 1 is floating. Due to the capacitance formed by the gate and drain of the P-MOS transistor MP 1 the transistor MP1 of the inverter INV is conducting. Therefore, the voltage at the node NET2 follows the positive test voltage Vpad at the I/O pad 2. Now, the fourth N-MOS transistor MN4 is conducting and clamps the I/O pad 2 to the reference potential VSS.

Second Operating Condition:

The I/O pad 2 shall be tested with a test voltage Vpad2 wherein the test voltage Vpad2 is positive versus the supply potential VDD. Now, the supply terminal 1 is grounded and the reference potential VSS is floating.

An optional P+ diode D can forward either a bias voltage or in case of an open drain the voltage Vpad2 at the I/O pad 2 to the supply terminal 1. Otherwise the voltage Vn1 at the node NET 1 is at low potential and therefore the P-MOS transistor MP1 of the inverter INV is conducting. The voltage Vn2 at the node NET2 follows the test voltage Vpad2 at the I/O pad 2, wherein the voltage Vn2=Vpad2−Vtr. The main clamp transistor MN4 conducts and forces the current towards the substrate. Any parasitic diode towards the supply voltage VDD will then lead the current, whereas in normal operating mode the parasitic diodes are nonconducting. A parasitic diode can be for example a n-well diode of a PMOS transistor connected between the supply potential VSS and the reference potential VDD.

Third Operating Condition:

The I/O pad 2 shall be tested with a test voltage Vpad3 wherein the test voltage Vpad3 is negative versus the reference potential VSS. In the third operating condition, the voltage VSS at the supply terminal 1 is grounded and the reference potential VDD is floating.

The clamp transistor MN4 is conducting and forces the ESD current to the substrate of the integrated circuit. The parasitic N+ diode D2 leads the current towards the I/O pad 2.

Regardless of the state of the circuitry all N+/substrate diodes connected to the I/O pad 2 are driven in forward direction. Such a N+/substrate diode can be for example a N+transistor diffusion. The ESD current flows from the reference node VSS to the I/0 pad 2.

Fourth Operating Condition:

The I/O pad 2 shall be tested with a test voltage Vpad4 wherein the test voltage Vpad4 is negative versus the reference potential VDD. In the fourth operating condition, the voltage VSS at the supply terminal 1 is floating and the reference potential VDD is grounded.

Either the optional diode D is forward BIASed or the transistor MP1 will conduct as described in the 1th operating condition and clamp MN4 force the ESD current to ground.

Thenafter as described in 3th operating condition the current will be forced via the parasitic diodes towards VDD.

Therefore, the invention combines the robustness of the state of the art GGNMOST concept together with the advantage of an active clamping.

As shown in FIG. 3, the protection circuit can also be used for protecting the power pin or power supply pad 3 against electrostatic discharge or electrostatic overstress. For that, the power supply pad 3 is connected to the drain terminal of the P-MOS transistor MP 1, the drain terminal of the fourth N-MOS transistor MN4 and the resistor R of the protection circuit. The protection circuit itself has not to be modified. Therefore it corresponds to the schema shown in FIG. 2. Regarding to the explanation of the protection circuit reference is made the above section.

With the help of the active clamp trigger circuit AC each kind of N-MOS transistor clamp MN4 can be driven. For example, a N-MOS transistor layouted for protection against ESD can be used as transistor clamp NM4. It is also possible to use for a big output buffer the pull down N-MOS transistor. Depending on the width to length relation this transistor can be designed as a normal N-MOS transistor or as a N-MOS transistor with special ESD constrains.

Figure 1:
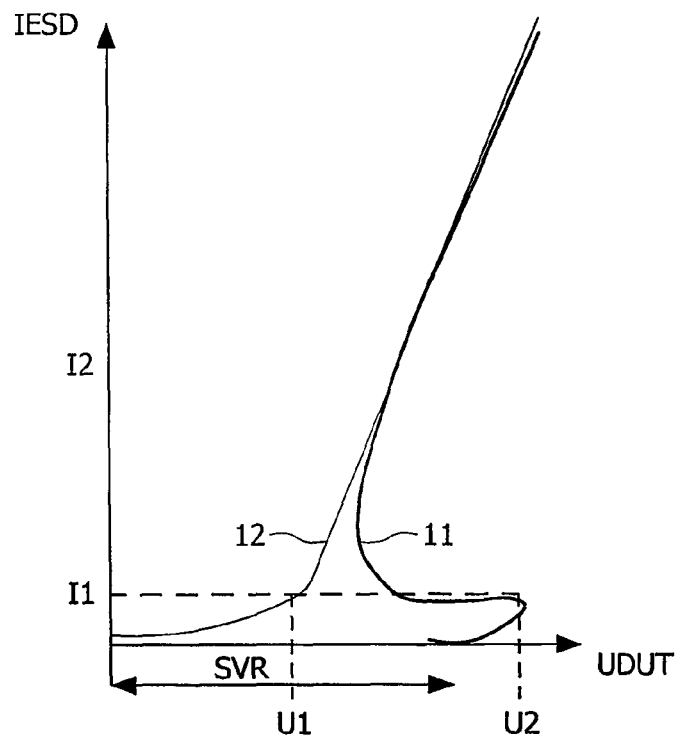
Figure 2:
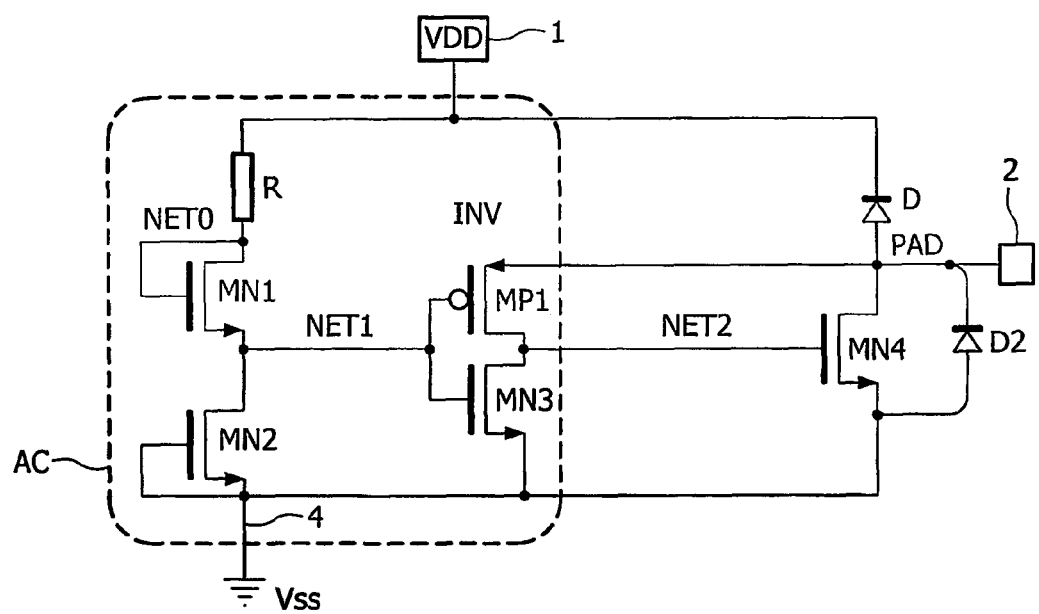
Figure 3:
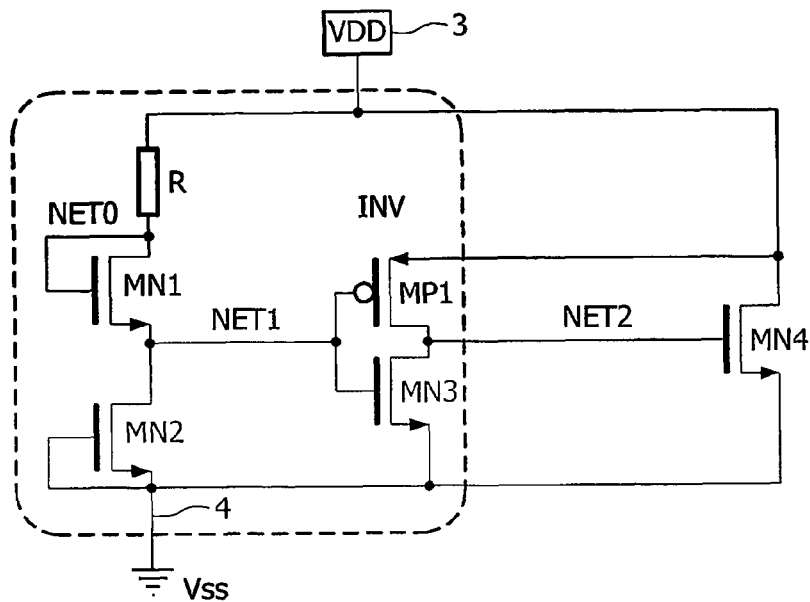
Figure 4:
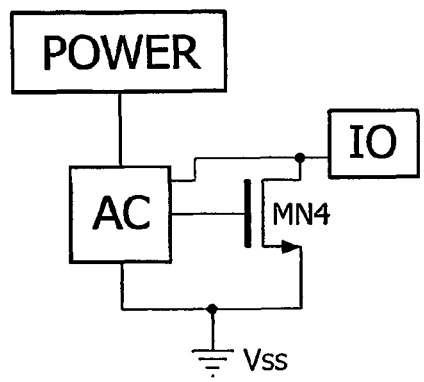
FIG. 4 shows a block diagram of the ESD protection circuit according to the invention used for an I/O pad. Thereby, the active trigger circuit AC controls the clamp transistor MN4.
Figure 5:
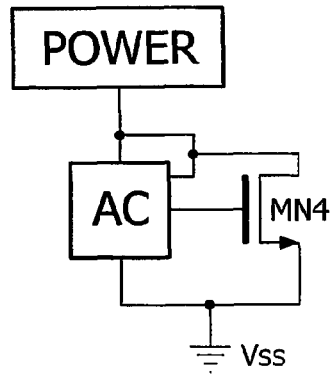
FIG. 5 shows a block diagram of the ESD protection circuit according to the invention used for a power pad. As already mentioned, the active trigger circuit AC controls the clamp transistor MN4.
Figure 6:
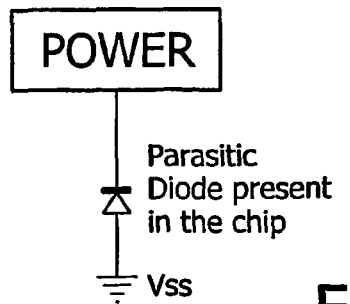

FIG. 6 shows how a parasitic diode is arranged in the integrated circuit. In normal operating mode the parasitic diode or parasitic diodes respectively are nonconducting.

In the following, an example is given for dimensioning the resistor R and the transistors MN1, MN2, MN3, MN4 and MP1. For the transistors MN1, MN2, MN3, MN4 and MP1 the dimension refers to the ratio channel width to channel length, wherein both are given in µm.

| Element | Dimension | Description |
| --- | --- | --- |
| R | ~100 Ohm | Protects the transistor MN1; |
| MN1 | 3/0.34 | Drives the node NET1 as fast as possible; |
| MN2 | 3/0.34 | In close mode: The node NET1 can easily rise the potential; In open mode: Acts like the transistor MN1; |
| MP1 | 8/0.34 | Drives the node NET2 as fast as possible; |
| MN3 | 1/0.34 | Weak pull down; In normal mode: Pulls the node NET2 down; In event driven mode: Allows the node NET2 to drive up easy; |
| MN4 | 100/0.34 | Main clamp; Layout with ESD layout properties (i.e. siprot) |

Having illustrated and described a preferred embodiment for a novel protection means for an integrated circuit, it is noted that variations and modifications in the device and the method can be made without departing from the invention or the scope of the appended claims.

REFERENCE NUMBER LIST

| 1 | power supply terminal |
| 2 | I/O pad |

-continued

| 3 | power supply pad |
| --- | --- |
| 4 | reference potential terminal |
| MN1 | first N-MOS transistor |
| MN2 | second N-MOS transistor |
| MN3 | third N-MOS transistor |
| MN4 | fourth N-MOS transistor |
| MP1 | P-MOS transistor |
| NET0 | node 0 or gate of MN1 |
| NET1 | first node or inverter input |
| NET2 | second node or inverter output |
| INV | inverter |
| D | optional P+ diode |
| D2 | parasitic N+ diode |
| VSS | reference potential |
| VDD | supply voltage |
| R | resistor |
| AC | active trigger circuit |
| U1 | first voltage |
| U2 | second voltage |

The invention claimed is:

1. An integrated protection circuit for an integrated circuit device, comprising:
a first transistor whose control outputs are connected between a pad and a control input of a clamping device, control outputs of said clamping device being connected between said pad and a reference voltage terminal,
a second transistor whose control outputs are connected between the control input of the clamping device and said reference voltage terminal, and
a time-delay circuit including a resistor and a capacitive device connected in series between a supply voltage terminal and control inputs of said first transistor and said second transistor.

2. The protection circuit according to claim 1, wherein the pad is a signal pad or a power supply pad.

3. The protection circuit according to claim 1, wherein the time-delay circuit comprises a third transistor, the resistor being connected between the supply voltage terminal and said third transistor, said third transistor forming the capacitive device, and a node between the resistor and the third transistor being connected to a control input of the third transistor.

4. The protection circuit according to claim 3, wherein a fourth transistor provided whose control outputs are connected between the reference voltage terminal and the control output of the third transistor and whose control input is connected to said reference voltage terminal.

5. The protection circuit according to claim 4, wherein the second, third and fourth transistor are n-channel MOS transistors.

6. The protection circuit according to claim 1, wherein the first transistor (MPI) is a p-channel MOS transistor.

7. The protection circuit according to claim 1, wherein the clamping device is a n-channel MOS transistor laid out for ESD protection.

8. The protection circuit according to claim 1, wherein the clamping device is a parasitic npn transistor.

9. The protection circuit according to claim 1, wherein the clamping device is a thyristor.

10. The protection circuit according to claim 1, wherein a diode is connected between the pad and the supply voltage terminal.

11. An integrated protection circuit for protecting an integrated circuit device, the protection circuit comprising:
a clamping device having a control input and two control outputs, the control outputs including a first control output coupled to a pad and a second control output coupled to a reference voltage terminal;

a first transistor having control outputs connected between the pad and the control input of the clamping device;

a second transistor having control outputs connected between the reference voltage terminal and the control input of the clamping device; and a time-delay circuit including a resistor and a capacitive device connected in series between a power supply and the control inputs of the first and second transistors, the resistor being connected to the power supply and the capacitive device being connected to the control inputs of the first and second transistors.

12. The circuit of claim 11, wherein the capacitive device is not directly coupled to the pad.

13. The circuit of claim 11, wherein the resistor is directly connected to the capacitive device with no intervening circuits.

14. The circuit of claim 11, further including a diode coupled directly between the power supply and the pad with no intervening circuits, the diode adapted to mitigate current flow from the power supply to the pad.

* * * * *